(12) United States Patent
Van Schoot et al.

(10) Patent No.: US 8,830,444 B2
(45) Date of Patent: Sep. 9, 2014

(54) LITHOGRAPHIC APPARATUS AND METHOD

(75) Inventors: Jan Bernard Plechelmus Van Schoot, Eindhoven (NL); Igor Petrus Maria Bouchoms, Veldhoven (NL); Antonius Johannes Josephus Van Dijsseldonk, Hapert (NL); Markus Franciscus Antonius Eurlings, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 511 days.

(21) Appl. No.: 13/279,770

(22) Filed: Oct. 24, 2011

(65) Prior Publication Data

US 2012/0147346 A1 Jun. 14, 2012

Related U.S. Application Data

(60) Provisional application No. 61/422,410, filed on Dec. 13, 2010.

(51) Int. Cl.
*G03F 7/20* (2006.01)
*G03B 27/54* (2006.01)
*G03B 27/58* (2006.01)

(52) U.S. Cl.
CPC ............ *G03F 7/70558* (2013.01); *G03B 27/54* (2013.01); *G03B 27/58* (2013.01); *G03F 7/709* (2013.01)
USPC .............................................. 355/53; 355/77

(58) Field of Classification Search
CPC ... G03F 7/70558; G03F 7/709; G03F 7/7085; G03F 7/70775; G03F 7/70716; G03F 7/70625; G03F 7/70608; G03F 7/70041

USPC .................................... 355/30, 53, 72, 75, 77
See application file for complete search history.

(56) References Cited

U.S. PATENT DOCUMENTS

| | | | |
|---|---|---|---|
| 5,028,797 A * | 7/1991 | Abe et al. ....................... | 250/548 |
| 5,883,701 A * | 3/1999 | Hasegawa et al. .............. | 355/53 |
| 6,335,784 B2 | 1/2002 | Mishima | |
| 2003/0147060 A1* | 8/2003 | Tokuda et al. .................. | 355/53 |
| 2006/0268252 A1* | 11/2006 | Na .................................. | 355/67 |

FOREIGN PATENT DOCUMENTS

| | | |
|---|---|---|
| JP | 09-199386 A | 7/1997 |
| JP | 2002-217101 A | 8/2002 |

OTHER PUBLICATIONS

Honda, T., et al., "Influence of resist blur on ultimate resolution of ArF immersion lithography", J. Microlith., Microfab., Microsyst., vol. 5, No. 4., Oct.-Dec. 2006; pp. 043004-1 to 043004-6 (2006).

(Continued)

*Primary Examiner* — Steven H Whitesell Gordon
(74) *Attorney, Agent, or Firm* — Sterne, Kessler, Goldstein & Fox P.L.L.C.

(57) ABSTRACT

A lithographic apparatus comprising a source that generates a beam of radiation, a support structure supporting a patterning device, a substrate table for holding a substrate, and a projection system projecting the patterned radiation beam onto a target portion of the substrate. The lithographic apparatus further comprises a vibration measurement apparatus configured to measure relative vibration between the patterning device and the substrate during exposure of the target portion. A control apparatus adjusts power of the radiation beam to compensate for the effect of the measured relative vibration on the pattern projected onto the substrate.

15 Claims, 2 Drawing Sheets

(56) References Cited

OTHER PUBLICATIONS

Figure 1:
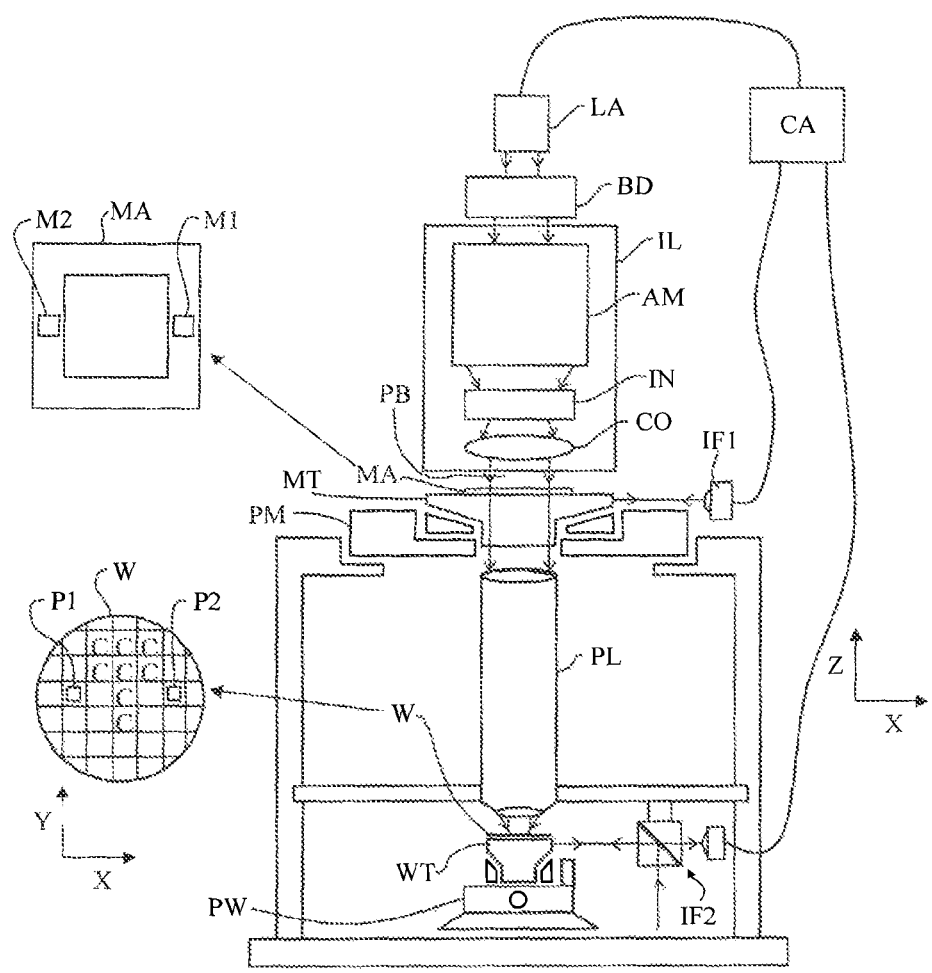

Honda, T., et al., "What determines the ultimate resolution? The critical relationship between exposure tools and photoresists", Proc. of SPIE—Optical Microlithography XIX, vol. 6154; pp. 615422-1 to 615422-9 (2006).

LaGrange, A., et al., "Assembly of a 193-nm interferometer for immersion lithography: vibration effects on image contrast", Proc. of SPIE—Optical Microlithography XIX, vol. 6154; pp. 61544O-1 to 61544O-5 (2006).

"Lithography apparatus", Research Disclosure Journal, Research Disclosure Database No. 559001; 4 pages (2010).

English-Language Abstract for Japanese Patent Publication No. 2002-217101 A, published Aug. 2, 2002; 1 page.

* cited by examiner

LITHOGRAPHIC APPARATUS AND METHOD

CROSS REFERENCE TO RELATED APPLICATIONS

This application claims the benefit under 35 U.S.C. §119 (e) to U.S. Provisional Patent Application No. 61/422,410, filed Dec. 13, 2010, which is incorporated by reference herein in its entirety.

FIELD OF THE PRESENT INVENTION

The present invention relates to a lithographic apparatus and a device manufacturing method.

RELATED ART

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed.

Known lithographic apparatus include so-called scanners, in which each target portion is irradiated by scanning the mask through a radiation beam in a given direction (the "scanning"-direction) while synchronously scanning the substrate parallel or anti parallel to this direction. After each scan the direction of scanning movement of the mask and the direction of scanning movement of the substrate is reversed. The substrate is also moved transverse to the scanning direction. These movements are time consuming and thus have a detrimental impact on the throughput of the lithographic apparatus (i.e., the number of substrates exposed per hour by the lithographic apparatus).

SUMMARY

It is desirable to provide, for example a lithographic apparatus and device manufacturing method which obviates or mitigates one or more of the problems of the prior art, whether identified herein or elsewhere.

According to an aspect of the present invention, there is provided a lithographic apparatus comprising a source configured to generate a beam of radiation, a support structure for supporting a patterning device, the patterning device serving to impart the radiation beam with a pattern in its cross-section, a substrate table for holding a substrate, and a projection system for projecting the patterned radiation beam onto a target portion of the substrate. The lithographic apparatus further comprises a vibration measurement apparatus, configured to measure relative vibration between the patterning device and the substrate during exposure of the target portion, and a control apparatus, configured to adjust the power of the radiation beam to compensate for the effect of the measured relative vibration on the pattern projected onto the substrate.

According to a further aspect of the present invention, there is provided a method comprising using a source to generate a beam of radiation, using a patterning device to impart the radiation beam with a pattern in its cross-section, and using a projection system to project the patterned radiation beam onto a target portion of the substrate. The method further comprises measuring relative vibration between the patterning device and the substrate during exposure of the target portion and adjusting the power of the radiation beam to compensate for the effect of the measured relative vibration on the pattern projected onto the substrate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts a lithographic apparatus according to an embodiment of the present invention.

Figure 2:
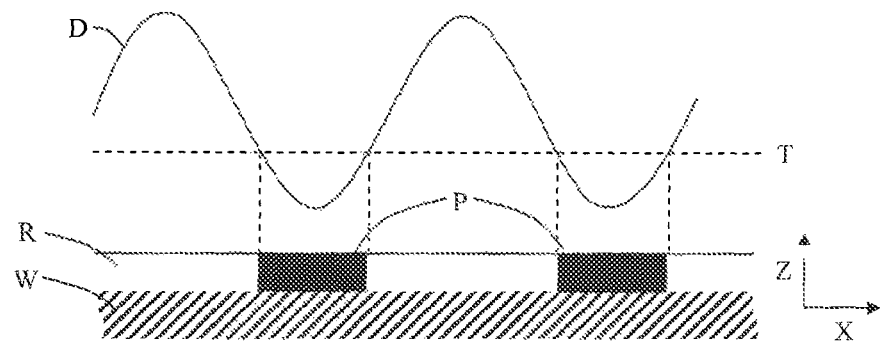

FIG. 2 schematically depicts exposure of part of a substrate by a lithographic apparatus in the absence of vibrations.

Figure 3:
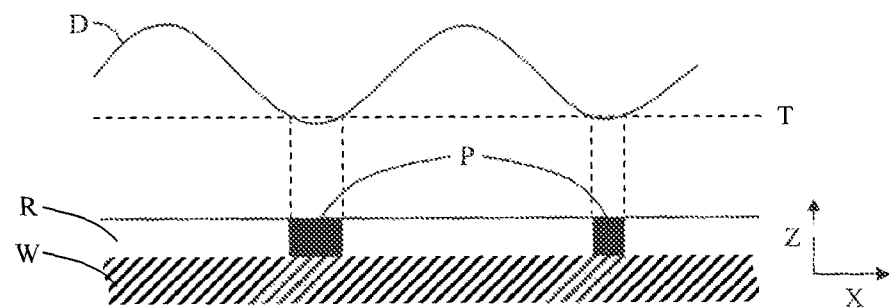

FIG. 3 schematically depicts exposure of part of a substrate by a lithographic apparatus in the presence of vibrations.

Figure 4:
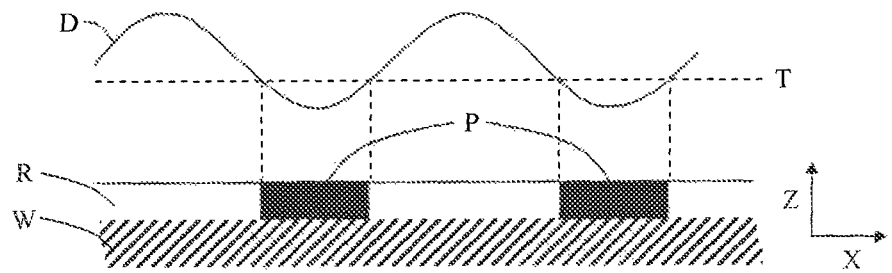

FIG. 4 schematically depicts exposure of part of a substrate by a lithographic apparatus according to an embodiment of the present invention in the presence of vibrations.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein may be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

Examples of patterning devices include a mask (also referred to as a reticle) and an array of individually controllable elements. The mask may be transmissive or reflective. Masks are well known in lithography, and include mask types such as binary, alternating phase-shift, and attenuated phase-shift, as well as various hybrid mask types. Examples of arrays of individually controllable elements include programmable mirror arrays and programmable LCD panels.

A support structure (also referred to as a mask table) holds the patterning device. It holds the patterning device in a way that depends on the orientation of the patterning device, the design of the lithographic apparatus, and other conditions, such as for example whether or not the patterning device is held in a vacuum environment. The support structure may use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. The term "mask table" may be considered synonymous with the more general term "support structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the teem "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion techniques are well known in the art for increasing the numerical aperture of projection systems.

FIG. 1 schematically depicts a lithographic apparatus according to a particular embodiment of the present invention. The apparatus comprises an illumination system (illuminator) IL to condition a beam PB of radiation (e.g., DUV radiation or EUV radiation), a mask table MT to support a mask MA and connected to first positioning device PM to accurately position the patterning device with respect to item PL, a substrate table (e.g., a wafer table) WT for holding a substrate (e.g., a resist coated wafer) W and connected to second positioning device PW for accurately positioning the substrate with respect to item PL, and a projection system (e.g., a refractive projection lens) PL configured to image a pattern imparted to the radiation beam PB by mask MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a laser LA (or other radiation source). The laser may for example be an excimer laser. The laser LA and the illuminator IL, together with a beam delivery system BD if required, may be referred to as a radiation system.

The illuminator IL may comprise adjusting means AM for adjusting the angular intensity distribution of the beam. Generally, at least the outer and/or inner radial extent (commonly referred to as -outer and -inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the mask MA, which is held on the mask table MT. Having traversed the mask MA, the beam PB passes through the lens PL, which focuses the beam onto a target portion C of the substrate W. With the aid of the second positioning device PW and a second position sensor IF2 (e.g., an interferometric device), the substrate table WT can be moved accurately, e.g., so as to position different target portions C in the path of the beam PB. Similarly, the first positioning device PM and a first position sensor IF1 (e.g., an interferometric device) can be used to accurately position the patterning device MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. Mask MA and substrate W may be aligned using mask alignment marks M1, M2 and substrate alignment marks P1, P2.

The depicted apparatus can be used in the following preferred modes:

1. In scan mode, the mask table MT and the substrate table WT are scanned synchronously while a pattern imparted to the beam PB is projected onto a target portion C (i.e., a single dynamic exposure). The velocity and direction of the substrate table WT relative to the mask table MT is determined by the reduction factor and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

2. In another mode, the mask table MT is kept essentially stationary holding a programmable patterning device, and the substrate table WT is moved or scanned while a pattern imparted to the beam PB is projected onto a target portion C. In this mode, generally a pulsed radiation laser is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above. The programmable patterning device may for example be an array of individually controllable elements.

Combinations and/or variations of the above described modes of use or entirely different modes of use may also be employed.

The lithographic apparatus further comprises a control apparatus CA which is connected to the first and second positions sensors IF1, IF2 and receives output signals from them. The control apparatus CA is connected to the laser LA and controls the power of the radiation beam generated by the laser. The control apparatus CA may adjust the power of the radiation beam generated by the laser LA in order to change the dose of radiation delivered to the substrate W and thereby compensate for contrast loss caused by vibrations of the mask table MT and the substrate table WT.

When the lithographic apparatus is operated in scan mode, the mask table MT and substrate table WT are scanned synchronously, as explained further above. The throughput of the lithographic apparatus depends to a significant extent upon the speed at which the mask table MT and the substrate table WT are moved. Thus, the mask table MT and substrate table WT may be scanned at speeds which are sufficiently high that they may cause vibrations of the mask table and/or substrate table to occur. If the vibrations are small then they may have a negligible effect upon images exposed on the substrate (or may have an effect which is sufficiently small that it does not compromise the patterns exposed on the substrate). However, if the vibrations are large then they may have a significant detrimental effect upon the patterns exposed on the substrate. The vibrations may for example prevent functional devices (e.g., integrated circuits) exposed on the substrate from operating correctly.

An undesirably large vibration may be experienced during a particular portion of the scanning movement of the substrate table WT and/or the scanning movement of the mask table MT. For example, the undesirable vibration may occur at the end of each scanning movement. In this example this may lead to a stripe being formed on the substrate at the end of each target portion, the stripe comprising pattern features which have incorrect dimensions and/or have been formed incorrectly. If the unwanted vibration were to occur in some other part of the scanning movement then the stripe would be located in a corresponding part of the target portion. Irrespective of the position in the scanning exposure at which the unwanted vibration occurs, the stripe will always run transverse to the direction of scanning movement.

FIG. 2 shows schematically exposure of lines in resist R provided on a substrate W. Radiation having a generally sinusoidal dose profile D is incident upon the resist R which has a threshold T (indicated by a dotted line). At locations where the dose D of the radiation exceeds the threshold T the resist R is exposed by the radiation (a chemical changes takes place in a resist). Exposure of the resist reduces the chemical resistance of the resist to a developer solution. Following exposure of the resist a developer solution is used to remove the exposed resist, thereby leaving behind a pattern P formed from unexposed resist (in this case a pair of lines). Etching and/or depositing of material may be used to convert the pattern formed in the resist into a permanent structure. The structure may for example comprise lines which are located between the lines P of unexposed resist.

FIG. 3 is a schematic illustration of the effect that vibrations may have upon the exposure of resist. In FIG. 3, the vibrations have reduced the contrast of the radiation incident upon the resist, as indicated schematically by the relative shallowness of the dose profile D of the radiation. As a result of the reduced contrast, the parts of the resist which are exposed by the radiation are widened and the unexposed parts are correspondingly narrowed. Thus, lines P formed in unexposed resist are narrower than desired. Embodiments of the present invention reduce this undesirable effect.

The embodiment of the present invention illustrated in FIG. 1 measures the vibration of the mask table MT and the substrate table WT using the first and second position sensors IF1, IF2. The mask MA is securely held by the mask table MT, and the substrate W is securely held by the substrate table WT. Thus, the measurements of the vibration of the mask table MA and substrate table WT provide measurements of the vibration of the mask M and the substrate W. The measured vibrations are passed to the control apparatus CA. The control apparatus CA reduces the power of the radiation generated by the laser LA to compensate for reduced contrast caused by vibrations of the substrate table WT and/or mask table MT.

The effect of reducing the power of the radiation generated by the laser LA is shown schematically in FIG. 4. FIG. 4 is intended to represent a situation in which the vibration is the same as the vibration which applies in FIG. 3. Thus, the dose profile D of the radiation has the same reduced contrast in FIG. 4 as is seen in FIG. 3. In FIG. 3 the reduced contrast widened the parts of the resist which were exposed by the radiation and correspondingly narrowed the width of unexposed parts of the resist. However, as may be seen in FIG. 4, reducing the dose of the radiation reduces the proportion of the resist which is exposed because a smaller proportion of the resist receives a dose of radiation which exceeds the threshold T. Thus, the width of the portions of resist which are exposed by the radiation corresponds with that seen in FIG. 2 (i.e., the lines which are formed in the resist have a desired width). When a developer solution is used to remove the exposed resist this leaves behind a pattern P formed from unexposed resist which has desired dimensions. Etching and/or depositing of material may then form lines located between the lines P of unexposed resist which have desired dimensions. The effect of the vibrations has therefore been compensated for by reducing the power of the radiation generated by the laser LA (through a reduction of the dose of radiation incident upon the resist R).

Compensation for the effect of the measured relative vibration of the mask table MT and the substrate table WT includes the situation in which the pattern projected onto the substrate corresponds to the pattern that would have been projected in the absence of any relative vibration (referred to here as the desired pattern). An example of this is illustrated in FIG. 4. Compensation for the effect of the measured relative vibration also includes the situation in which the pattern projected onto the substrate is closer to the desired pattern than would be the case if the compensation had not been applied but does not correspond to the desired pattern (e.g., a pattern in which the features have dimensions which are between FIGS. 2 and 3). In other words, compensation includes an improvement of the projected pattern (compared with the projected pattern in the absence of compensation).

The control apparatus may monitor the relative vibration of the mask table MT and the substrate table WT. Although it is unlikely to occur, it is instructive to consider a situation in which vibration of the substrate table WT is synchronized both in amplitude and direction with vibration of the mask table MT. Where this is the case, there is no relative vibration between the substrate table WT and the mask table MT and no loss of contrast will be seen in the dose profile of radiation incident upon the substrate W. Consequently, no stripes caused by vibration will be present in the exposed pattern. Thus, relative vibration between the mask table MT and the substrate table WT may be taken into account by the control apparatus CA when controlling the power of radiation generated by the laser LA (and thus determining the dose to be applied to the substrate). If the projection system PL has a reduction factor (e.g., a reduction factor of 4), then the relative vibration measurement takes this into account.

The relative vibration may be measured as a rolling average, for example taking into account the period of time during which a given location on the substrate will receive radiation during a scanning exposure. The measurement which is used to characterize the relative vibration may for example be a moving standard deviation (an average of the standard deviation). The moving standard deviation may be measured using a time window which corresponds to the period of time during which a given location on the substrate will receive radiation during a scanning exposure.

Adjustment of the power of radiation generated by the laser LA may be performed in real time by the control apparatus CA. The lithographic apparatus may include an intensity sensor (not shown) which is configured to measure the intensity of radiation generated by the laser LA. The control apparatus CA may take into account the output of the intensity sensor when controlling the power of radiation generated by the laser LA.

The power adjustment may be based upon calibration measurements performed on the lithographic apparatus (or a similar lithographic apparatus). The calibration measurements may measure a relationship between the radiation contrast at the substrate and relative vibrations between the mask table MT and substrate table WT. The calibration measurements may determine how much the power of the laser LA should be reduced in order to compensate for reduced contrast caused by the relative vibrations. The results of the calibration measurements may be stored in a memory which is in the control apparatus (or is connected to the control apparatus). The results of the calibration measurements may be stored in the form of a look-up table (or in some other manner). Interpolation between calibration measurement values may be performed by the control apparatus.

The laser LA may for example generate pulses of radiation. Where this is the case, a desired dose of radiation may be delivered to a given location on the substrate using a plurality of radiation pulses (e.g., 30 pulses). The control apparatus CA may control the laser LA such that the energy of the pulses generated by the laser sum together to provide a desired total radiation dose at the exposure location, the desired total radiation dose taking into account relative vibration of the mask table MT and the substrate table WT. Adjustment of the power provided by the laser LA may for example be performed on a pulse by pulse basis. For example, if a first pulse delivered to the exposure location has too much energy, then the energy of the second pulse may be lowered to compensate for this. If the second pulse has an energy which is too low, then the third pulse may have a higher energy to compensate for this. Controlling the energy of the laser pulses in this manner may provide iterative control of the dose of radiation delivered to the exposure location.

The energy of pulses of laser radiation may be changed by changing the peak power of the pulses and/or changing the duration of the pulses. In an embodiment, the dose of radiation delivered to a given location on the substrate may be controlled by controlling the frequency at which laser pulses are generated (sometimes referred to as the repetition rate of a laser).

The laser LA may for example generate a continuous beam of radiation. Where this is the case, the control apparatus may control the power of the radiation beam generated by the laser.

If a source other than a laser is used to generate the beam of radiation, the control apparatus may control the power of the radiation beam generated by the source.

The effect of the contrast loss caused by vibration may be different for different pattern features. For example, dense lines may be more affected by vibrations than isolated lines (or may be affected in a different way). If a pattern that is being projected onto a substrate comprises a plurality of different features, then adjustment of the radiation to compensate for vibrations may be optimized for the most critical feature of the pattern (i.e., compensation using the radiation may take into account the manner in which that feature is affected by contrast loss).

In an embodiment, vibrations measured during a previous scanning exposure may be used to determine in advance the power of radiation to be generated by the laser LA during a subsequent scanning exposure. This may be used for example if different scanning exposures suffer from the same or similar relative vibrations between the mask table MT and the substrate table WT. This may be the case for example for scanning exposure of target portions located in a particular area of the substrate.

In an embodiment, vibrations measured during exposure of a previous substrate may be used to determine in advance the power of radiation to be generated by the laser LA during exposure of a subsequent substrate. This may be used for example if relative vibrations between the mask table MT and the substrate table WT have been found to be consistent during exposure of successive substrates.

Although the described embodiment uses interferometric devices IF1, IF2 to monitor the positions of the mask table MT and substrate table WT, any suitable position monitoring apparatus may be used. For example, encoders may be used. The position monitoring apparatus may for example measure the deviation of the position of the mask table MT or substrate table WT from a desired position.

Although the described embodiment of the present invention relates to scanning lithographic exposures, the present invention may be used in other forms of lithographic apparatus. For example, the present invention may be used in a lithographic apparatus which uses an array of individually controllable elements which is stationary and which scans the substrate (e.g., mode 2 described above). Where this is the case the array of individually controllable elements may be assumed not to vibrate during scanning movement of the substrate, and relative vibration between the programmable patterning device and the substrate may be determined based solely on measured vibration of the substrate table.

The description of the embodiment of the present invention mostly refers to a mask MA held by a mask table MT. These may be considered to be specific examples of a patterning device and a support structure for supporting the patterning device. The patterning device may for example be an array of individually controllable elements, and the support structure may for example support the array of individually controllable elements.

Although the embodiment of the present invention has been described in the context of positive resist, the present invention may also be used for negative resist. If negative resist is used then the power of the source is increased to compensate for vibrations instead of being decreased.

Although described embodiments of the present invention measure vibration of the substrate W by monitoring the position of the substrate table WT, vibration of the substrate may be measured by monitoring the position of any suitable entity. For example, vibration of the substrate may be measured by directly monitoring the position of the substrate.

Although described embodiments of the present invention measure vibration of the mask MA by monitoring the position of the mask table MT, vibration of the mask may be measured by monitoring the position of any suitable entity. For example, vibration of the mask may be measured by directly monitoring the position of the mask.

While specific embodiments of the present invention have been described above, it will be appreciated that the present invention may be practiced otherwise than as described. The description is not intended to limit the present invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the technology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A lithographic apparatus comprising:
   a source configured to generate a beam of radiation;
   a support structure configured to supporting a patterning device, the patterning device serving to impart the radiation beam with a pattern in its cross-section;
   a substrate table configured to hold a substrate;
   a projection system configured to project the patterned radiation beam onto a target portion of the substrate;
   a vibration measurement apparatus configured to measure relative vibration between the patterning device and the substrate during exposure of the target portion; and
   a control apparatus configured to adjust power of the radiation beam to compensate for effect of the measured relative vibration on the pattern projected onto the substrate.

2. The apparatus of claim 1, wherein the vibration measurement apparatus is configured to measure the relative vibration by measuring the vibration of the patterning device support structure and the vibration of the substrate table.

3. The apparatus of claim 1, wherein the control apparatus is configured to adjust the power of the radiation beam according to a previously measured relationship between relative vibration and radiation contrast at the substrate.

4. The apparatus of claim 1, wherein the control apparatus is configured to calculate a rolling average of the relative vibration.

5. The apparatus of claim 1, wherein:
   the source is a laser which is configured to generate pulses of radiation; and
   the control apparatus is configured to adjust the power of the radiation beam by adjusting the energy of pulses generated by the laser.

6. The apparatus of claim 1, wherein the adjustment of the power of the radiation beam provides real time compensation for the measured vibration.

7. The apparatus of claim 1, wherein the adjustment of the power of the radiation beam provides compensation for vibration measured during exposure of a previous target portion.

8. The apparatus of claim 1, wherein the adjustment of the power of the radiation beam provides compensation for vibration measured during exposure of a previous substrate.

9. The apparatus of claim 1, wherein the control apparatus is configured to adjust the power of the radiation beam, such that it compensates a most critical feature of the projected pattern for the measured vibration.

10. The apparatus of claim 1, wherein the lithographic apparatus is a scanning lithographic apparatus, and the vibration measurement apparatus comprises a position sensor configured to measure vibrations of the patterning device support structure and a position sensor configured to measure vibrations of the substrate table.

11. The apparatus of claim 1, wherein:
the patterning device comprises an array of individually controllable elements; and
the vibration measurement apparatus comprises a position sensor configured to measure vibrations of the substrate table.

12. A method comprising:
using a source to generate a beam of radiation;
using a patterning device to impart the radiation beam with a pattern in its cross-section;
projecting the patterned radiation beam onto a target portion of a substrate;
measuring relative vibration between the patterning device and the substrate during exposure of the target portion; and
adjusting power of the radiation beam to compensate for an effect of the measured relative vibration on the pattern projected onto the substrate.

13. The method of claim 12, wherein the power of the radiation beam is adjusted according to a previously measured relationship between relative vibration and radiation contrast at the substrate.

14. The method of claim 12, further comprising using a laser to generate the radiation beam generated by pulses of radiation, wherein the power of the radiation beam is adjusted by adjusting the energy of pulses generated by the laser.

15. The method of claim 12, wherein the adjustment of the power of the radiation beam provides compensation for vibration measured during exposure of a previous target portion of the substrate or of a target portion of a previous substrate.

* * * * *